United States Patent [19]

Robin et al.

[11] Patent Number: 4,571,014

[45] Date of Patent: Feb. 18, 1986

[54] HIGH FREQUENCY MODULAR CONNECTOR

[75] Inventors: Max S. Robin, Denville; Peter J. Tamburro, Toms River; Roger E. Weiss, Denville, all of N.J.

[73] Assignee: AT&T Bell Laboratories, Murray Hill, N.J.

[21] Appl. No.: 606,141

[22] Filed: May 2, 1984

[51] Int. Cl.[4] ........................ H01R 13/46; H01R 4/66

[52] U.S. Cl. .............................. 339/14 R; 339/143 R

[58] Field of Search ............ 339/14 R, 17 LM, 17 M, 339/143 R, 17 LC

[56] References Cited

U.S. PATENT DOCUMENTS

| | | | |
|---|---|---|---|
| 3,035,244 | 5/1962 | Aveni | 339/17 LC |
| 3,208,028 | 9/1965 | Mittler et al. | 339/143 R |
| 3,432,801 | 3/1969 | Ruotolo | 339/143 R |
| 3,564,343 | 2/1971 | Guest et al. | 339/17 LC |
| 4,008,941 | 2/1977 | Smith | 339/17 LC |
| 4,017,770 | 4/1977 | Valfre | 339/176 MP |
| 4,148,543 | 4/1979 | Shores | 339/143 R |
| 4,157,612 | 6/1979 | Rainal | 339/176 MF |
| 4,206,963 | 6/1980 | English et al. | 339/147 R |
| 4,265,549 | 5/1981 | Cote | 339/17 F |
| 4,382,653 | 5/1983 | Blanchard | 339/143 R |
| 4,457,574 | 7/1984 | Walters | 339/143 R |
| 4,477,022 | 10/1984 | Shuey et al. | 339/89 M |

OTHER PUBLICATIONS

"Shielded In-Line Electrical Multiconnector", by J. Straus, IBM Bulletin, vol. 10, No. 3, Aug. 1967.

*Primary Examiner*—Gil Weidenfeld
*Assistant Examiner*—Gary F. Paumen
*Attorney, Agent, or Firm*—Dwight A. Marshall

[57] ABSTRACT

A high frequency modular connector (1) for use with a circuit board (2) to interconnect the circuit board with a backplane (3) of equipment mounting apparatus. The connector apparatus comprises connector modules (10, 12) each having a row and column configuration of first contacts (1014) for engaging the backplane with each first contact connected by a shielded conductor path (1010) with a corresponding second contact (1013) for engaging the circuit board. A conducting member (13) surrounds the first contacts and engages a spring conducting member (11) positioned between and electrically engaging the connector modules. The spring conducting member is biased in engagement with grounding apparatus of the backplane to provide a common ground for shielding the connector apparatus.

16 Claims, 7 Drawing Figures

3
10
12
13
1
30
100
1002
1014
2
1013

100
102
1020
1016
101
1001
100
1016
101
1014
102
1021
1100
11
1102
112
1121
1120
13
130
130
130
1101
100
102
101
100
101
102
12
1100
1022
1017
1002
1017
1022
1002
10

3
31
30
13
1014
1011
101

HIGH FREQUENCY MODULAR CONNECTOR

TECHNICAL FIELD

This invention relates to connector apparatus. In particular it relates to connector apparatus mounted on a plug-in circuit board for use in interconnecting printed wiring circuitry of the circuit board with backplanes of equipment mounting apparatus.

BACKGROUND ART

Plug-in circuit boards having electronic components located thereon that are interconnected by printed wiring circuitry of the circuit board are widely used in the Telecommunication and Computer Industry. These types of circuit boards are oftentimes inserted in equipment mounting apparatus used to interconnect the circuit boards to form electronic systems such as telecommunication switching and computer systems. In general, the equipment mounting apparatus comprises frames having grooves located therein which receive edges of a circuit board and guide the circuit board to engage apparatus used to connect circuit boards together to form an electronic system.

The interconnecting apparatus may consist of a connector for receiving a circuit board and printed wiring circuitry for interconnecting the connector with terminals provided to terminate wiring of the equipment mounting apparatus. Printed wiring circuitry used to connect the connector with terminals of the equipment mounting apparatus oftentimes have long parallel electrical conducting paths each coupling a connector contact with a corresponding terminal. Such long parallel electrical conducting paths are generally not suitable for use in high speed data circuits of telecommunication switching and computer systems because of objectional crosstalk generated in a conductor path by data signals occurring in adjacent conductor paths.

Various designs have been developed to improve the transmission characteristics of these types of connector apparatus. For example, one connector assembly uses printed wiring circuitry to interconnect a connector with cable assemblies wherein conductor paths of the printed wiring circuitry are connected to a common ground bus and used to separate adjacent signal carrying conductor paths. A problem with this type of connector apparatus is that each signal carrying conductor path is not surrounded by shielding and a shielding discontinuity exists at the connector where the printed wiring circuitry is connected to backplane circuitry of the equipment mounting apparatus.

Connector apparatus has been mounted on a circuit board and designed to engage other connector apparatus terminating coaxial cables so that the coaxial cables may be coupled with the circuit board. However such connector apparatus is bulky in size and is not suitable for use in high density plug-in circuit board applications wherein circuit board microprocessors are required to be coupled to high density backplane pin arrays of equipment mounting apparatus.

Accordingly, a need exists for a high frequency connector for use with a circuit board to interconnect the circuit board with the backplane of equipment mounting apparatus. A need also exists for a high density and high frequency connector mounted on a plug-in circuit board to interconnect high speed circuitry of the circuit board with equipment mounting apparatus backplanes by the use of electrically shielded conductor paths.

SUMMARY OF THE INVENTION

The foregoing problems are solved and a technical advantage is achieved by modular connector apparatus provided for use with a circuit board to interconnect the circuit board with a backplane by electrically shielded conductor paths and contacts having a minimum of crosstalk interference.

In accordance with the invention, modular connector apparatus includes interconnecting apparatus having connector modules with female contacts for engaging male pins of backplane apparatus and male contacts for engaging a circuit board with shielded conductor paths electrically connecting each female contact with a corresponding male contact. Apparatus surrounds and shields the female contacts and spring member apparatus engaging the connector modules biases the shielding apparatus in engagement with the backplane apparatus to establish a common ground for shielding the modular connector.

Also in accordance with the invention, a modular connector comprises a pair of connector modules each having a shield member separating a pair of circuit board members each having shielded female and male contacts positioned along adjacent edges of an outer surface and each having an electrical conductor path connecting a female contact to a corresponding male contact with an electrical shield path separating adjacent ones of the electrical conductor paths.

Also in accordance with the invention, a modular connector for use in interconnecting a circuit board with a backplane comprises a corrugated conducting member slidably inserted around female contacts positioned on a pair of modules of the connector to engage the backplane and shield the female contacts connected with shielded conductor paths used to interconnect the backplane with the circuit board.

In further accordance with the invention, a modular connector for use in interconnecting a circuit board with a backplane comprises a spring shielding member juxtaposed between adjacent modules of the connector for biasing a corrugated conducting member slidably inserted around contacts of the conductor modules into engagement with the backplane to establish a common ground plane for use in shielding conductor paths and contacts interconnecting the circuit board with the backplane.

DESCRIPTION OF THE DRAWING

The foregoing as well as other objects, features and advantages of the invention will be more apparent from a description of the drawing in which.

DESCRIPTION OF THE INVENTION

1. Apparatus

Figure 1:
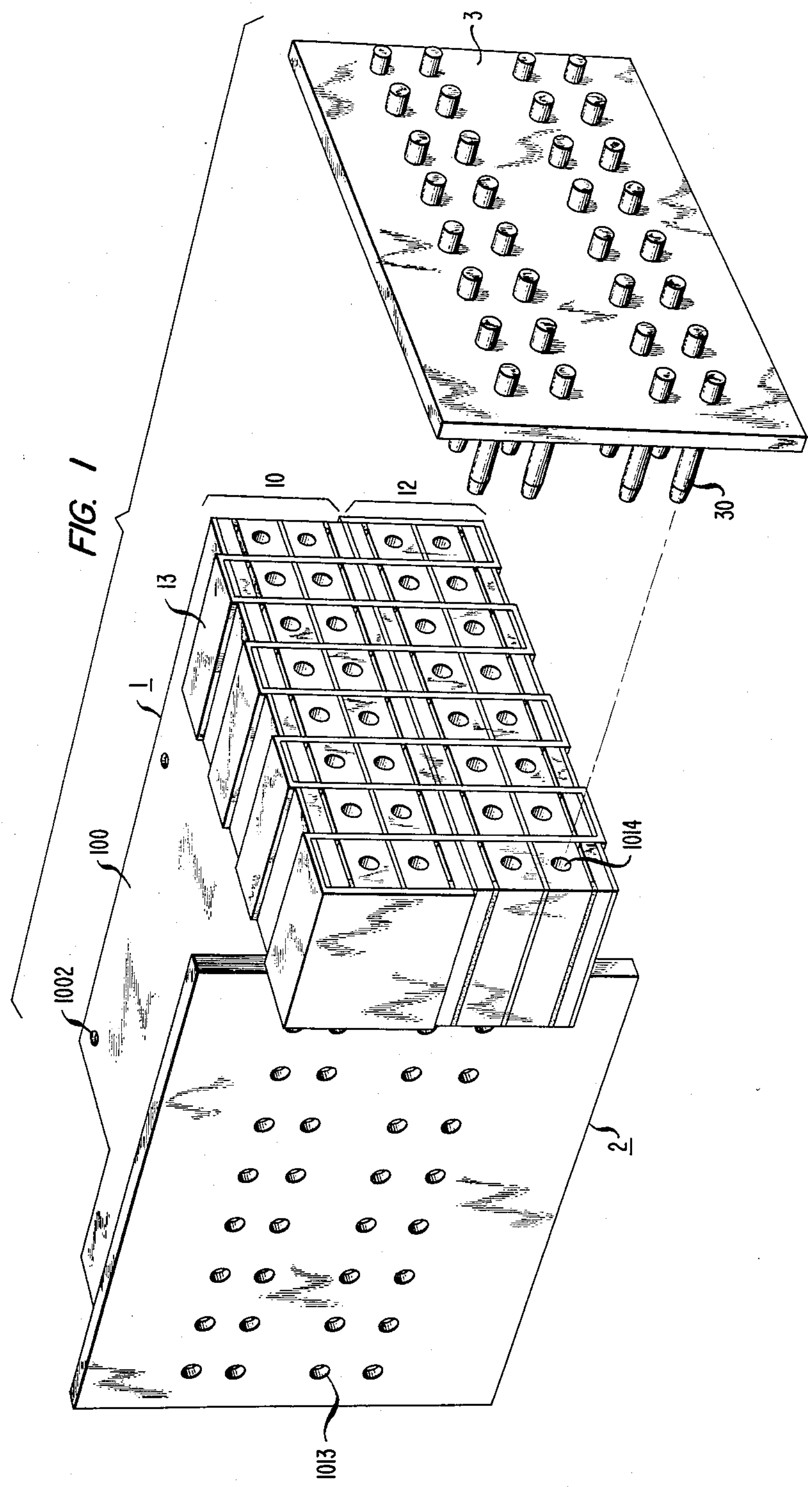
FIG. 1 is a view of high frequency modular connector apparatus embodying the principles of the instant invention.

Referring to the drawing and more specifically to FIG. 1 of the drawing, modular connector apparatus 1 set forth therein is intended for use with circuit board 2 to interconnect the circuitry thereof with backplane 3 of equipment mounting apparatus. Typically, circuit board 2 is of a type commonly known as a plug-in circuit board and is intended to be slidably inserted into equipment mounting apparatus so that a number of circuit boards may be interconnected to form an electronic system such as telecommunication switching and computer systems.

Equipment mounting apparatus is well known in the Electronic and Telecommunication Industry and need not be described for an understanding of the instant invention. Sufficient to say that equipment mounting apparatus oftentimes has a structure such as backplane 3 which is a part of the equipment mounting apparatus and is intended for use in interconnecting a number of plug-in circuit boards together. Backplane 3 may be a printed wiring type of circuit board wherein printed wiring circuitry located on either the back or front sides of backplane 3 is connected with terminals such as male pins 30 and is used to connect plug-in circuit boards together. In another type of design backplane 3 may be used to mount male pins 30 that are wire-wrapped to cable connectors used to interconnect backplanes and frames of equipment mounting apparatus together to form an electronic system.

In the present embodiment of the invention each male pin 30 is assumed to be connected to a high frequency signal carrying conductor such as a center conductor of a coaxial cable. Modular connector apparatus 1, hereinafter referred to as modular connector 1, is mounted on circuit board 2 and interconnects the printed wiring circuitry of circuit board 2 by electrically shielded conductor paths with male pins 30 of backplane 3. The insertion of circuit board 2 into equipment mounting apparatus engages a row and column figuration of female contacts 1014 of modular connector 1 with male pins 30 of backplane 3. Shielded connections are thereby established from male pins 30, through female contacts 1014, over electrically shielded conductor paths and through male contacts 1013 of modular connector 1 to the printed wiring circuitry of circuit board 2. Corrugated member 13, in a manner hereinafter described in detail, is spring biased to engage grounding apparatus of backplane 3 and electrically shield female contacts 1014 and conductor paths of modular connector 1.

Modular connector 1, as set forth in the drawing, has a pair of connector modules 10,12 each with a row and column configuration of female contacts 1014. It is to be understood that modular connector 1 is not limited to a pair of connector modules but may advantageously be assembled with either one or a number of connector modules depending upon the particular circuit board application.

Figure 2:
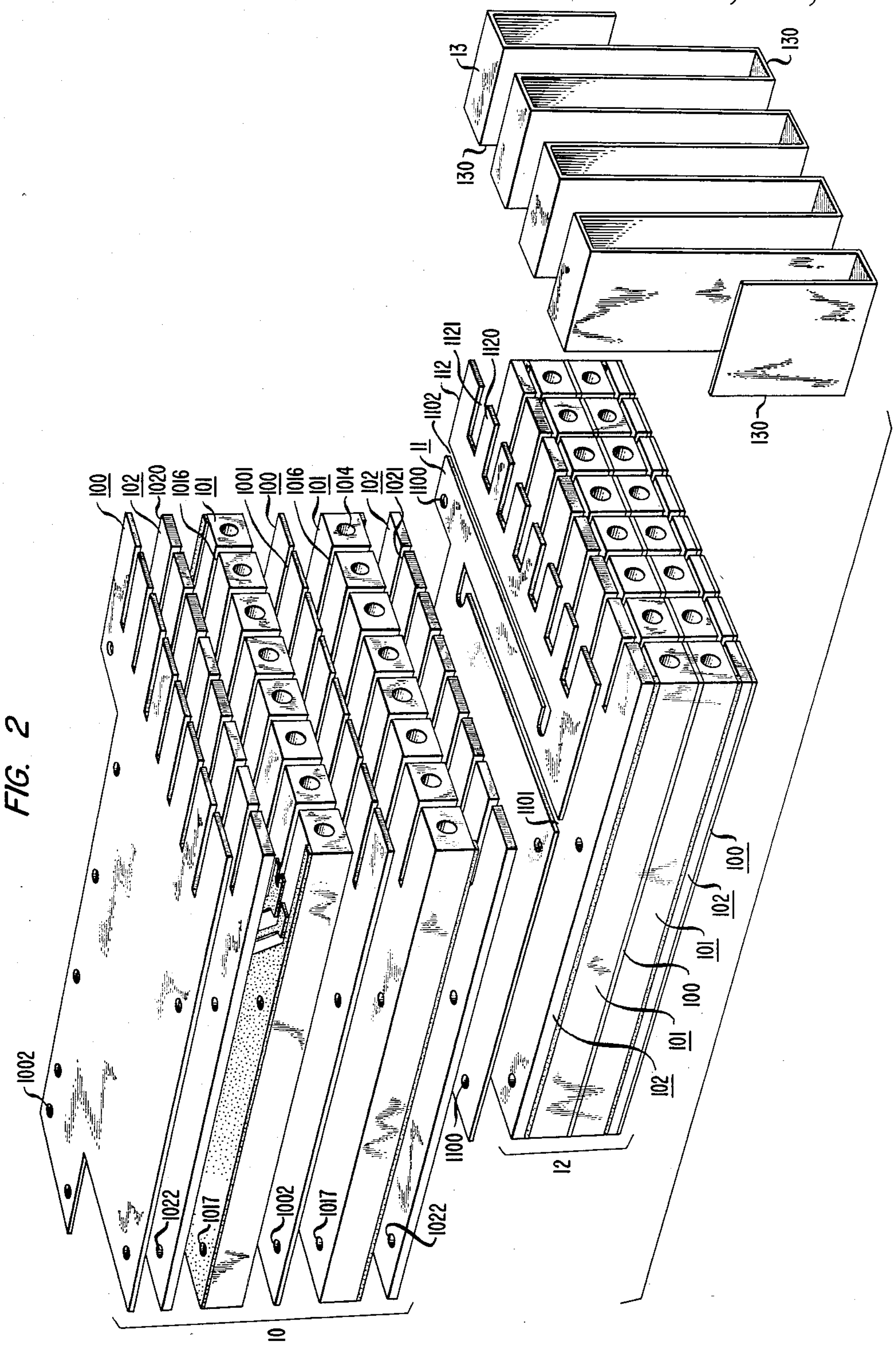
FIG. 2 is a view illustrating component part assembly of the modular connector apparatus set forth in FIG. 1.
Figure 3:
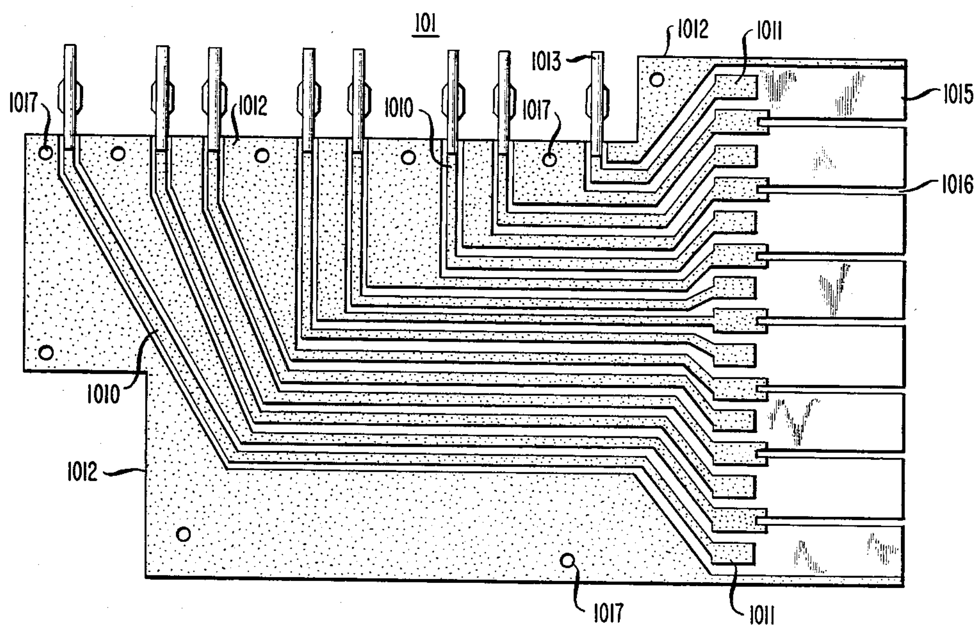
FIG. 3 is a detailed view of a circuit board member of the modular connector apparatus of FIG. 1 for interconnecting a circuit board with a backplane of equipment mounting apparatus.

Referring now to FIG. 3 of the drawing, connector modules 10,12 each have a pair of epoxy glass or equivalent type of circuit board member 101 of a general rectangular configuration. Each circuit board member 101 is formed with a number of fingers 1015 which are separated by slots 1016 formed to slidably receive an edge of corrugated conducting member 13, FIG. 2.

Figure 7:
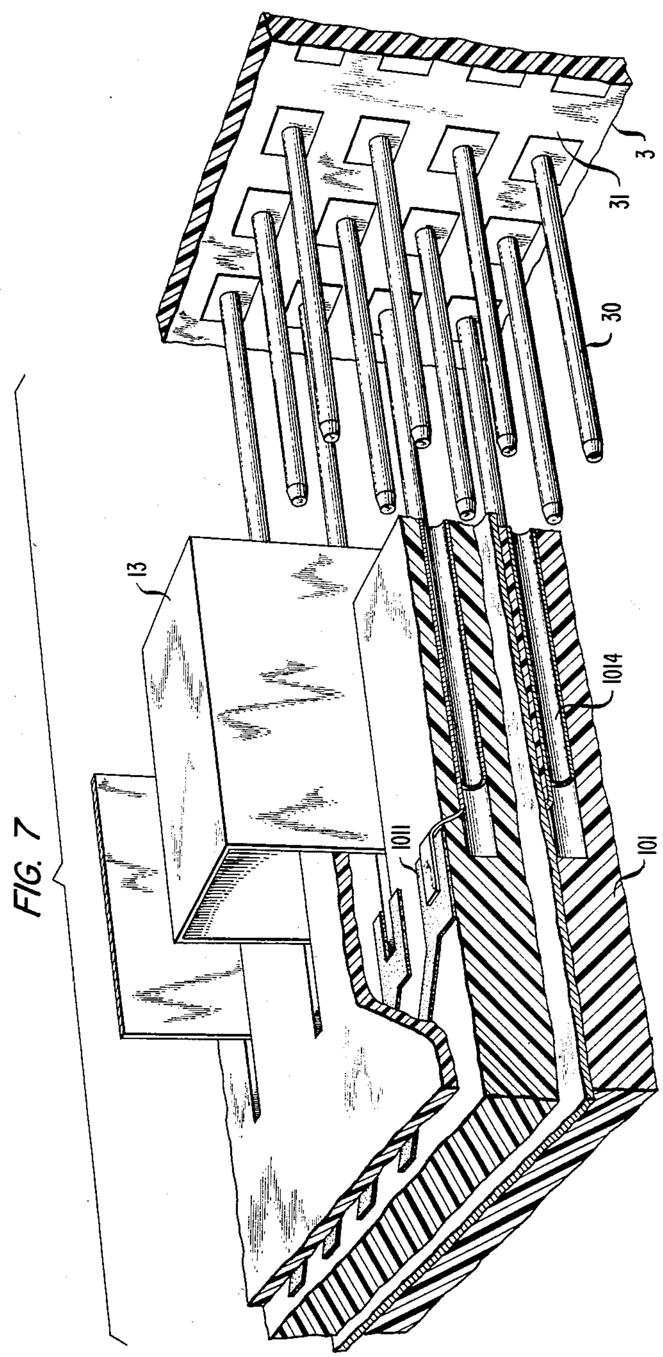
FIG. 7 is a fragmentary sectional view illustrating engagement of a contact and corrugated conducting member of the modular connector apparatus of FIG. 1 with male pins and a backplane of equipment mounting apparatus.

Each finger 1015 is intended to receive a contact, such as female contact 1014, FIG. 7, which is aligned and positioned with other female contacts 1014 on fingers 1015 along one edge of an outer surface, FIG. 3, of circuit board member 101 in a row configuration for engaging backplane 3. A tail of a female contact is affixed to a land 1011 positioned on finger 1015 and is extended by an electrical conductor path 1010 to a male contact 1013. Male contacts 1013 are aligned and positioned on an outer surface of circuit board member 101 along an edge adjacent to fingers 1015 for engaging circuit board 2. Male contacts 1013 may be either soldered to circuit board 2 or have a compliant center section which may be inserted into plated through holes of circuit board 2 to hold modular connector 1 in place.

Each electrical conductor path 1010 positioned on circuit board member 101 is separated from an adjacent electrical conductor path 1010 by an electrical shield path 1012. Electrical shield paths 1012 in combination with other shield members, hereinafter described, shield each electrical conductor path 1010 to provide a low crosstalk connection between the circuitry of circuit board 2 and backplane 3. Plated through holes 1017 located in each electrical shield path 1012 enables each shield path to be electrically coupled to the shield members of modular connector 1.

Figure 5:
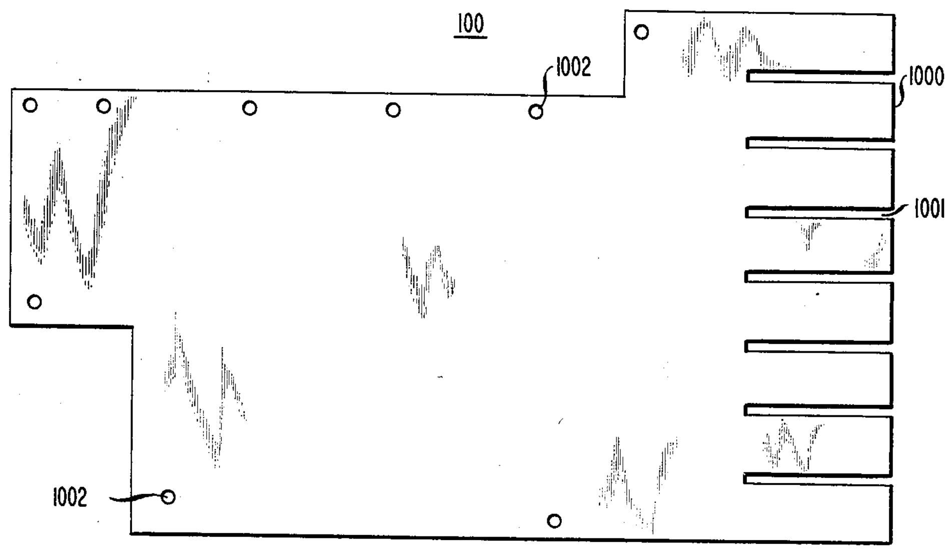
FIGS. 5 and 6 illustrate electrical shielding and insulating members of the modular connector apparatus set forth in FIG. 1.

Each connector module 10,12, FIG. 2, also includes conductive shield members 100 and spacer members 102. A conductive shield member 100, as set forth in FIG. 5, is formed of an electrically conducting material, such as copper or copper alloy, and has the same general rectangular configuration as circuit board member 101. One end thereof is formed with a number of fingers 1000 each separated by a slot 1001 configured to slidably receive corrugated conducting member 13. In addition, each conductive shield member 100 has holes 1002 each aligned with a corresponding plated through hole 1017 of circuit board member 101 used in the assembly of modular connector 1.

Figure 6:
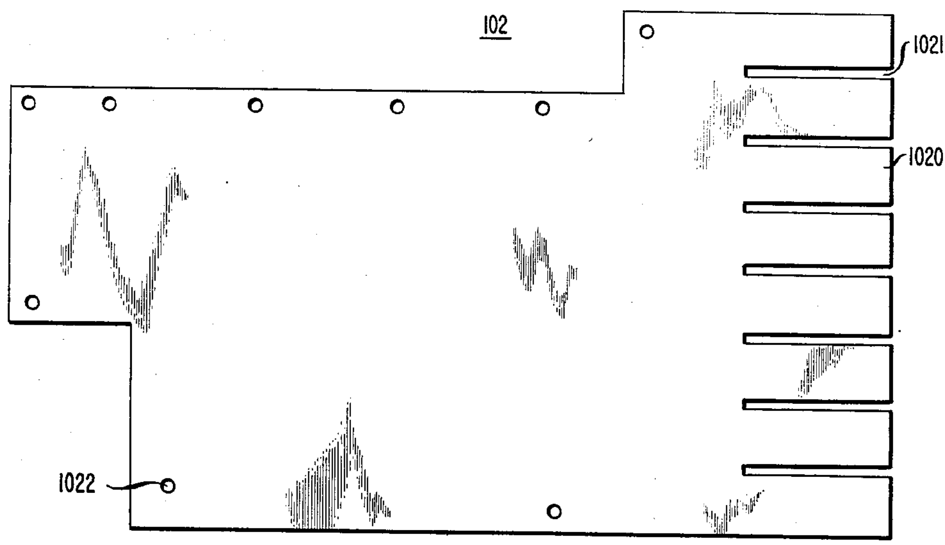

Spacer members 102, as set forth in FIG. 6 of the drawing, are formed from a thin sheet of electrically insulating material to have the same rectangular configuration as conductive shield members 100 and circuit board members 101. Similiarily, spacer members 102 are formed with fingers 1020 at one end thereof with each separated by slots 1021 having sufficient width to slidably receive corrugated conducting member 13. Each spacer member 102 has holes 1022 aligned with holes 1002 and 1017, respectively, of conductive shielding members 100 and circuit board members 101.

Figure 4:
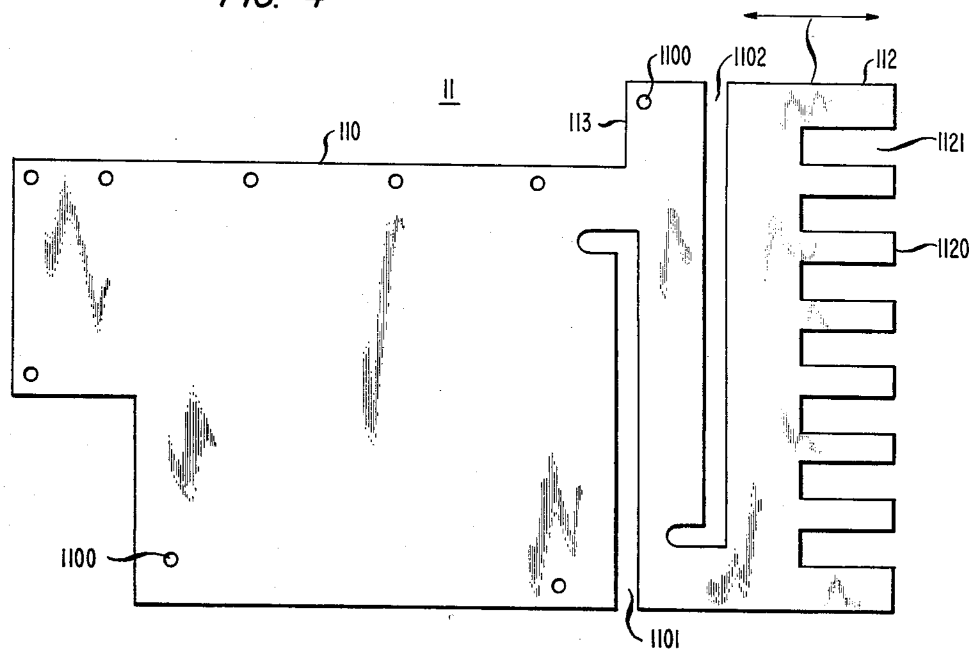
FIG. 4 is a view illustrating a conductive shield member having a spring section for biasing the modular connector apparatus of FIG. 1 into engagement with equipment mounting apparatus backplanes.

Referring now to FIG. 4 of the drawing, modular connector 1 includes conductive shield member 11 formed of an electrically conducting material such as copper or a copper alloy. Conductive shield member 11 has the same general rectangular configuration as conductive shield members 100 but distinguishes therefrom in that rectangular sections 112 and 113 are formed to have a slightly smaller thickness than section 110. Section 112 has one edge formed into fingers 1120 each separated by slots 1121 slightly wider and less deep than slots 1001 of conductive shield member 100. Slots 1102 and 1101 partially separate section 112 from section 113 and section 113 from section 110, respectively, such that sections 112 and 113 form a spring member that enables lateral movement of fingers 1120 and slots 1121 with respect to section 110. Holes 1100 are aligned with respect to holes 1002 of conductive shield members 100.

Modular connector 1, FIG. 2 of the drawing, also includes corrugated member 13 which is formed from an electrically conducting material such as copper or a copper alloy. The thickness of the material forming edges 130 and the distance between adjacent edges 130 enable corrugated member 13 to slidably inserted into the slots of the insulating, shielding and circuit board members of modular connector 1.

2. Assembly

A connector module, for example, connector module 10, is assembled by placing one of the conductive shield members 100 between two adjacent circuit board members 101. Thus, female contacts 1014 are aligned and positioned along one edge of an outer surface of circuit board members 101 in a row and column configuration for engaging backplane 3. Male contacts 1013, not shown in FIG. 2, are aligned and positioned on one edge adjacent female contacts 1014 of each circuit board member 101 for engaging circuit board 2. A pair of spacer members 102 are each positioned over an outer surface of circuit board members 101 with fingers 1020 overlaying corresponding fingers 1015. Spacer members 102 each insulate the conductor paths 1010 connecting female contacts 1014 with male contacts 1013 from conductive shield members 11 and 100.

Another conductive shield member 100 is positioned over one of spacer members 102 to electrically shield conductor paths 1010 located on one of the circuit board members 101. Conductive shield member 11 is juxtaposed between adjacent spacer members 102 of a pair of connector modules 10, 12 and is joined by conducting rivets or pins forced through holes 1002, 1022, 1017 and 1100 such that conductive shield members 100 and 11 are electrically coupled with shield paths 1012, FIG. 3, of cirucit board member 101 to shield conductor paths 1010.

Corrugated conducting member 13, FIG. 2, is inserted around female contacts 1014 of connector modules 10, 12 into slots 1016, 1001 and 1021 to engage the spring member of conductive shield 11. In the normal position conductive shield member 11 maintains the outer edge 130 of corrugated conducting member 13 slightly forward of the vertical plane of female contacts 1014.

The insertion of circuit board 2 into equipment mounting apparatus, FIG. 7, results in the engagement of male pins 30 of backplane 3 with female contacts 1014 of modular connector 1. As circuit board 2 is continued to be inserted into the equipment mounting apparatus, corrugated conducting member 13 comes into engagement with grounding apparatus 31 of backplane 3 and moves deeper into the modular connector slots compressing the spring member of conductive shield member 11. When circuit board 2 and modular connector 1 are fully seated within the equipment mounting apparatus with male pins 30 of backplane 3 engaged with female contacts 1014, the spring member of conductive shield member 11 biases corrugated conducting member 13 in engagement with grounding apparatus 31 of backplane 3 to establish a common ground coupled with the conductive shield paths and members of modular connector 1 for electrically shielding contacts and conductor paths interconnecting circuit board 2 with backplane 3. In another embodiment of the invention corrugated member 13, FIG. 2, may be a layer of electrically conducting copper or copper alloy that is plated around female contacts 1014 and along the sides of slots 1016, 1001 and 1021 of circuit board member 101, conductive shield member 100 and spacer member 102 respectively. The plating, FIG. 3, is electrically coupled with electrical shield paths 1012 which in turn are coupled with conductive shield member 11. Engagement of the spring member of conductive shield member 11 with grounding apparatus 31, FIG. 7, of backplane 3 establishes a common ground for modular connector 1 that is coupled with the copper plating layer, conductive shield members 11, 100 and electrical shield paths 1012 to shield female contacts 1014 and conductor paths 1010.

SUMMARY

It is obvious from the foregoing that the facility, economy and efficiency of connector apparatus may be substantially enhanced by a high frequency modular connector intended for use with a plug-in circuit board to interconnect high speed circuitry of the circuit board by electrically shielded conductor paths and contacts with backplanes of equipment mounting apparatus. It is further obvious that a slidable corrugated conducting member shielding a row and column configuration of connector contacts and spring biased in engagement with grounding apparatus of a backplane to establish a common ground shielding for a modular connector facilities the use of a high density connector to interconnect a plug-in circuit board with a backplane.

While the modular connector apparatus of the instant invention has been disclosed with female contacts to engage male pins of a backplane and male pins for engaging a circuit board it to be understood that such an embodiment is intended to be illustrative of the principles of the invention and that numerous other arrangements may be devised by those skilled in the art without departing from the spirit and scope of the invention.

For example, the instant modular connector could use shielded male pin contacts to engage backplane female contacts and spring contacts intended to be soldered to the circuitry of a circuit board.

What is claimed is:

1. Modular connector apparatus (1) for use with a circuit board (2) and backplane apparatus (3) comprising:

means for interconnecting the circuit board with the backplane apparatus

CHARACTERIZED IN THAT:

Said interconnecting means comprises modular means (10, 12) having contacts (1013, 1014) for engaging the backplane apparatus and the circuit board and having conductor paths (1010) separated by shield paths (1012)

which electrically shield each conductor path from adjacent conductor paths, said conductor paths adapted for electrically connecting ones of said contacts with corresponding other ones of said contacts, means (13) slidably surrounding said one contacts for electrically shielding said one contacts, and means (11) electrically engaging said modular means shield paths and electromechanically engaging said slidably shielding means for biasing said slidably shielding means in engagement with the backplane apparatus to provide a common ground for electrically shielding said modular connector apparatus.

2. The modular connector apparatus set forth in claim 1

CHARACTERIZED IN THAT:

said modular means comprises connector modules (10, 12) having a shield member (100) and a pair of circuit board members (101) adjacent said shield member with each said circuit board member having female and male contacts positioned along adjacent edges thereof and each having one of said electrical conductor paths (1010) connecting each female contact (1014) with a corresponding male contact (1013) and ones of said electrical shield paths (1012) separating said electrical conductor paths.

3. The modular connector apparatus set forth in claim 2.

CHARACTERIZED IN THAT:

said connector modules each comprise:

spacer means (102) positioned adjacent an outer surface of said circuit board members for insulating said electrical conductor paths, and another shield member (100) positioned adjacent said spacer means insulating one of said circuit board members for shielding ones of said male contacts and electrical conductor paths.

4. The modular connector apparatus set forth in claim 3

CHARACTERIZED IN THAT:

said slidably shielding means comprises conducting means (13) slidably inserted around said female contacts for shielding each said female contact.

5. The modular connector apparatus set forth in claim 4.

CHARACTERIZED IN THAT:

said biasing means comprises:

spring conducting means (11) positioned between adjacent ones of said spacer means of said conductor modules and coupled with said shield members and electrical shield paths and engaging said conducting means for biasing said conducting means in engagement with the backplane apparatus to establish said common shielding ground plane.

6. A modular connector (1) for use with a circuit board (2) and backplane (3) comprising:

means for interconnecting the circuit board with the backplane

CHARACTERIZED IN THAT:

said interconnecting means comprises:

a pair of connector modules (10, 12) each having a plurality of insulated female contacts (1014) for engaging male pins (30) of the backplane and each connected by a shielded conductor path (1010) with a corresponding male contact (1013) for engaging the circuit board, means (13) slidably surrounding said insulated female contacts for electrically shielding each said female contact, and means (11) positioned between and engaging each of said connector modules for biasing said slidably shielding means in engagement with the backplane to provide a common ground plane for electrically shielding said connector modules.

7. The modular connector set forth in claim

CHARACTERIZED IN THAT:

said connector modules each comprise:

a first conductive shield member (100), first and second circuit board members (101) separated by said first conductive shield member, a plurality of said insulated female contacts aligned and positioned along one edge of said first and second circuit board members for engaging said backplane male pins, a plurality of said male contacts aligned and positioned along an edge adjacent said one edge of said first and second circuit board members for engaging the circuit board, and conducting means (1010, 1012) positioned on an outer surface of said first and second circuit board members and having electrical conductor paths (1010) for connecting each of said insulated female contacts with corresponding ones of said male contacts and having electrical shield paths (1012) for separating adjacent ones of said electrical conductor paths.

8. The modular connector set forth in claim

CHARACTERIZED IN THAT:

said connector modules each comprise:

a pair of spacer members (102) each positioned over said outer surface of said first and second circuit board members for insulating said electrical conductor paths, and a second conductive shield member (100) positioned over one of said spacer members for shielding ones of said electrical conductor paths.

9. The modular connector set forth in claim

CHARACTERIZED IN THAT:

said biasing means comprises:

a third conductive shield member (11) juxaposed between adjacent ones of said spacer members of said pair of connector modules and electrically coupled with said first and second conductive shield members and with said electrical shield paths for shielding said electrical conductor paths.

10. The modular connector set forth in claim

CHARACTERIZED IN THAT:

said slidably shielding means comprises:

a corrugated conducting member (13) slidably inserted around said female contacts and electrically engaging said third conductive shield member for shielding said female contacts.

11. The modular connector set forth in claim

CHARACTERIZED IN THAT:

said third conductive shield member comprises:

spring means (112, 113) slidably positioned between said adjacent connector modules for biasing said corrugaged conducting member in engagement with grounding apparatus of the backplane to establish said common shielding ground plane.

12. A modular connector (1) for use with a circuit board (2) and backplane apparatus (3) comprising:

means for interconnecting the circuit board with the backplane apparatus

CHARACTERIZED IN THAT:

said interconnecting means comprises:

a pair of connector modules (10, 12) each having a first conductive shield member (100) separating a pair of epoxy glass circuit board members (101) each having insulated female contacts (1014)

aligned and positioned along one edge thereof for engaging male pins of the backplane apparatus and male contacts (1013) aligned and positioned along an edge adjacent said one edge, for engaging the circuit board;

electrical conductor paths (1010) positioned on an outer surface of said epoxy glass circuit board members for connecting each insulated female contact with a corresponding one of said male contacts;

electrical shield paths (1012) positioned on said epoxy glass circuit board members outer surfaces for separating adjacent ones of said electrical conductor paths;

a pair of spacer members (102) each positioned over said electrical conductor and shield paths for insulating said electrical conductor paths;

a second conductive shield member (100) positioned over one of said spacer members for shielding ones of said electrical conductor paths;

a third conductive shield member (11) juxtaposed between adjacent ones of said spacer members of said pair of connector modules and coupled with said first and second conductive shield members and with said electrical shield paths for shielding said electrical conductor paths;

a corrugated conducting member (13) slidably inserted around said insulated female contacts and electrically engaging said third shield member for shielding said female contacts, and spring means (112, 113) of said third shield member for biasing said corrugated conducting member in engagement with rounding apparatus of the backplane apparatus to establish a common ground plane shielding said connector modules.

13. A high frequency modular connector for interconnecting a circuit board with a backplane of equipment mounting apparatus comprising:

modular means mounted on the circuit board and having a row and column configuration of first contacts for engaging the backplane and second contacts each connected to one of said first contacts by a shielded conductor path for engaging the circuit board, corrugated conducting means slidably surrounding said first contacts for shielding each said first contact, and means engaging said modular means and said corrugated conducting means for spring biasing said corrugated conducting means in engagement with ground apparatus of the backplane to establish a common shielding ground plane for said modular means.

14. The high frequency modular connector of claim 13 wherein said modular means comprise:

a first shield member, a pair of circuit board members positioned adjacent said first shield member and each having conducting means positioned on an outer surface thereof having conductor paths for connecting said each first contact with a corresponding second contact and shield paths separating said conductor paths;

a pair of spacer members each positioned adjacent said outer surface of each said circuit board member for insulating said conductor paths, and a second shield member positioned adjacent one of said spacer members opposite one of said circuit board members and electrically connected with said shield paths, said first shield member and said spring biasing member for electrically shielding said conductor paths.

15. The high frequency modular connector set forth in claim 14 wherein said spring biasing means comprises a third shield member positioned between and engaging ones of said modular means and having a spring member slidably positioned between said ones of said modular means for spring biasing said corrugated conducting means in engagement with the backplane.

16. Modular connector apparatus for use with a circuit board and backplane apparatus to interconnect the circuit board with the backplane apparatus comprising:

modular means mounting contacts and conductor paths interconnecting ones of said contacts for engaging and electrically interconnecting the backplane apparatus and circuit board and having shield paths and shield members separating adjacent ones of said conductor paths for electrically shielding ones of said conductor paths from adjacent ones of said conductor paths, conducting means electrically coupled with said shield paths and said shield members and plated around said one contacts for electrically shielding said one contacts, and means engaging said conducting means for spring biasing said modular means in engagement with the backplane apparatus to provide a common ground for electrically shielding said modular connector apparatus.

* * * * *